(12) United States Patent
Di Girolamo et al.

(10) Patent No.: US 12,677,521 B2
(45) Date of Patent: Jul. 7, 2026

(54) PHOTOVOLTAIC CELL COMPRISING A PEROVSKITE LAYER

(71) Applicant: 3SUN S.r.l., Catania (IT)

(72) Inventors: Diego Di Girolamo, Catania (IT); Giuliana Giuliano, Catania (IT); Marina Foti, Catania (IT); Cosimo Gerardi, Catania (IT)

(73) Assignee: 3SUN S.r.l., Catania (IT)

( * ) Notice: Subject to any disclaimer, the term of this patent is extended or adjusted under 35 U.S.C. 154(b) by 0 days.

(21) Appl. No.: 19/004,534

(22) Filed: Dec. 30, 2024

(65) Prior Publication Data

US 2025/0221140 A1    Jul. 3, 2025

(30) Foreign Application Priority Data

Dec. 28, 2023    (IT) ........................ 102023000028203

(51) Int. Cl.
H10K 30/88 (2023.01)
H10K 30/40 (2023.01)
H10K 30/57 (2023.01)

(52) U.S. Cl.
CPC ............. H10K 30/88 (2023.02); H10K 30/40 (2023.02); H10K 30/57 (2023.02)

(58) Field of Classification Search
CPC ........ H10K 30/88; H10K 30/40; H10K 30/57; H10K 30/50; H10K 85/50
See application file for complete search history.

(56) References Cited

U.S. PATENT DOCUMENTS

| | | | |
|---|---|---|---|
| 2018/0286596 A1 | 10/2018 | Snaith et al. | |
| 2018/0286998 A1* | 10/2018 | Watson | H10K 85/50 |
| 2020/0013974 A1 | 1/2020 | Fukumoto et al. | |
| 2022/0044878 A1* | 2/2022 | Shao | H10K 39/10 |
| 2022/0102659 A1* | 3/2022 | Kamino | H10F 10/16 |
| 2022/0108847 A1* | 4/2022 | Huang | H10K 85/50 |
| 2023/0403869 A1 | 12/2023 | Chen et al. | |
| 2024/0188311 A1* | 6/2024 | Lee | H10K 30/57 |
| 2025/0081711 A1* | 3/2025 | Krajewski | H10K 30/57 |

FOREIGN PATENT DOCUMENTS

| | | | | |
|---|---|---|---|---|
| CN | 105161623 A | * | 12/2015 | H10K 30/88 |
| KR | 20220167085 A | * | 12/2022 | H01L 27/302 |

OTHER PUBLICATIONS

Al2O3 datasheet, <https://web.archive.org/web/20221007145844/https://echa.europa.eu/registration-dossier/-/registered-dossier/16039/4/9>, Oct. 2022 (Year: 2022).*
SiC datasheet, Sigma-Aldrich Safety Data Sheet for Silicon Carbide, 2025 (Year: 2025).*
CN-105161623-A English machine translation (Year: 2015).*

(Continued)

*Primary Examiner* — Andrew J Golden

(57) ABSTRACT

A photovoltaic cell comprising at least one photovoltaic absorber layer based on lead halide perovskite comprising, in turn, a lead halide perovskite layer and a protection edge arranged so as to peripherally at least partially surround the lead halide perovskite layer and consisting of a material having at 25° C. a solubility in water that is equal to or smaller than $5*10\text{-}4$ mol/kg. The protection material is exclusively present in the protection edge.

8 Claims, 1 Drawing Sheet

(56) References Cited

OTHER PUBLICATIONS

European Search Report and the European Search Opinion Dated May 19, 2025 From the European Patent Office Re. Application No. 24223189.2. (11 Pages).

Qu et al. "Self-Powered Ultraviolet-Visible-Near Infrared Perovskite/Silicon Hybrid Photodetectors Based on A Novel Si/SnO2/MAPbl3/MoO3 Heterostructure", Applied Physics Express, XP093275691, 13(12): 121001-1-120001-5, Published Online Nov. 11, 2020.

Wikipedia "Aluminium Oxide", Wikipedia, The Free Encyclopedia, XP093275668, 1 P., Jan. 2013.

Rapporto di Ricerca e l'Opinione Scritta [Search Report and the Written Opinion] Dated Jul. 15, 2024 From the Ministero Delle Imprese e Del Made in Italy, Direzione Generale Sviluppo Produttivo c Competitivita, Ufficio Italiano Brevetti c Marchi Re. Application No. IT 202300028203. (12 Pages).

Chen et al. "Efficient and /Stable Perovskite Solar Cells Thanks to Dual Functions of Oleyl Amine-Coated PbSO4 (PbO)4 Quantum Dots: Defect Passivation and Moisture/Oxygen Blocking", Nano Energy, XO093181870, 68: 104313-1-104313-30, Feb. 2020.

Duong et al. "High Efficiency Perovskite-Silicon Tandem Solar Cells: Effect of Surface Coating Versus Bulk Incorporation of 2D Perovskite", Advanced Energy Materials, XP093123001, 10(9): 1903553-1-1903553-15, Jan. 31, 2020.

Kore et al. "Moisture Tolerant Solar Cells by Encapsulating 3D Perovskite With Long-Chain Alkylammonium Cation-Based 2D Perovskite", Communications Materials, XP093081405, 2(1): 100-1-100-10, Sep. 23, 2021.

Popov et al. "Atomic Layer Deposition of PbS Thin Films at Low Temperatures", Chemistry of Materials, XP093181869, 32(19): 8216-8228, Sep. 16, 2020.

Shi et al. "Two-Dimensional Halide Perovskite Lateral Epitaxial Heterostructures", Nature, XP037099612, 580(7805): 614-620, Published Online Apr. 29, 2020.

Wikipedia "Lead(ll) Sulfide", Wikipedia, XP093181868, 5 P., Sep. 13, 2006.

Wu et al. "Flexible Photodetector Arrays Based on Patterned CH3NH3PbI3-xClx Perovskite Film for Real-Time Photosensing and Imaging", Advanced Materials, XP071874928, 31(3): 1805913-1-1805913-7, Nov. 28, 2018.

* cited by examiner

PHOTOVOLTAIC CELL COMPRISING A PEROVSKITE LAYER

RELATED APPLICATIONS

This application is a Paris Convention, which claims the benefit of priority of Italian Patent Application No. 102023000028203 filed on Dec. 28, 2023. The contents of the above application is all incorporated by reference as if fully set forth herein in its entirety.

FIELD AND BACKGROUND OF THE INVENTION

The invention relates to a photovoltaic cell, whose photovoltaic absorber layer made of perovskite has an improved resistance to humidity.

The invention advantageously, though not exclusively applies to tandem photovoltaic cells, to which explicit reference will be made in the description below without because of this lacking generality.

For some time now, photovoltaic cells, thanks to the continuous decrease in the costs of the energy produced by them, have played a key role in reducing $CO_2$ emissions. In particular, the development of high-efficiency photovoltaic technologies has led to a reduction in plant costs in terms of occupied area.

Today, the technology based on crystalline silicon cells dominates the market of photovoltaic modules thanks to the low costs for manufacturing the modules as well as the high reliability of the technology itself. For this type of cells, the theoretical limit is approximately 29% and is due to factors such as, for example, the transparency of the absorber layer to below-bandgap photons and the losses due to thermalization in the case of high energy photons.

A solution to overcome these limiting factors is to combine various absorber materials with different band gaps in multi-junction photovoltaic cells. The use of wide-bandgap materials permits a reduction in the losses due to thermalization, while the collection of the remaining part of the light can take place with narrow-bandgap absorber layers. Tandem photovoltaic cells, which combine two component cells, represent the simplest multi-junction configuration.

In tandem cells, silicon is an excellent choice for the rear component cell thanks to the material band gap (1.1 eV), the open circuit voltage that can reach up to 750 mV and the possibility of using low-cost manufacturing processes. As far as the front component of the tandem cell is concerned, perovskite is one of the materials currently most studied and its use has made it possible to create a perovskite/silicon tandem cell with a record efficiency of 33.9%, a value that is already higher than the efficiency record of single-junction c-Si cells.

In particular, the technology based on perovskite cells with organometallic halides has greatly attracted the interest of the scientific community thanks to important features, such as direct bandgap, high absorption coefficients, excellent properties in terms of electrical transport. These properties have made it possible to obtain photovoltaic cells in the laboratory with efficiencies greater than 20%.

Actual perovskite is a mineral first found in 1839 in the Ural mountains and consisting of an oxide of Calcium and Titanium—$CaTiO_3$. Nowadays, the term perovskite refers to all those compounds that have the same ABX3 crystallographic structure, in which A is an atomic or molecular cation at the centre of a cube, B are cations placed at the vertices of the cube and X are smaller negatively charged atoms placed on the faces of the cube and that compose octahedral structures in B on each vertex of the cube. Depending on the type of atoms or molecules chosen, materials with peculiar and very interesting characteristics can be obtained, such as superconductivity, photoluminescence, which allow them to be used in many fields.

In the case of perovskite solar cells, the most outstanding and interesting results have been obtained with organic-inorganic hybrid structures, in which A is an organic cation e.g. of methylammonium, formamidinium or an inorganic cation e.g. cesium, B is an inorganic cation generally lead (+2), tin or germanium, while X is the halide anion (chloride, iodide, bromide).

In particular, in the last decade lead halide perovskite semiconductor materials have attracted enormous attention for their exceptional optoelectronic properties and high defect tolerance, finding application in a variety of optoelectronic devices such as solar cells, LEDS, photodetectors, photocatalysts, field-effect transistors, sensors and lasers.

Generally speaking, photovoltaic modules are laminated between two glass sheets by means of polymer-based encapsulants. One of the main roles of encapsulation concerns the protection of solar cells from humidity, since, as it is known, when water interacts with solar cells, it reduces their efficiency and reliability.

Solar cells usually consist of a stack of functional thin films with a thickness that can vary from a few nm to hundreds of $\mu$m. In solar cells with a multifilm structure, the edges constitute the most vulnerable portion for the stability and electrical properties of the solar cell as a whole. In fact, it is known in the field that it is difficult to achieve an even merge of high quality materials in the central portions and in the lateral portions of the substrate. In particular, the edges of the solar cells constitute one of the portions that first interacts with environmental stress factors, such as humidity and oxygen. To date, several studies have been carried out that confirm the degradation of solar cells due to the humidity that penetrates from the edges.

To this regard, the halide perovskite layers discussed above, due to their ionic nature, are particularly sensitive to humidity, to the point that standard encapsulation materials may not be able to guarantee the desired reliability.

SUMMARY OF THE INVENTION

Therefore, there is a need for a solution that ensures protection from humidity for photovoltaic cells comprising at least one perovskite film.

The inventors of this invention found a solution, whose technical features are such as to ensure that the aforesaid need is fulfilled through the presence of a particular protection edge portion in the area of the perovskite layer.

The subject-matter of the present invention is a photovoltaic cell comprising at least one lead halide perovskite layer; said photovoltaic cell being characterized in that it comprises a protection edge arranged so as to peripherally at least partially surround said lead halide perovskite layer; said protection edge having a height equal to that of the lead halide perovskite layer and a width ranging from 0.02 mm to 2 mm, preferably ranging from 0.05 mm to 1 mm, and consisting of a protection material having a solubility in water at 25° C. that is equal to or smaller than $5*10^{-4}$ mol/kgH2O; said protection material being exclusively present in said protection edge.

The inventors have identified the characteristic relating to solubility as an essential technical characteristic of the material useful for carrying out the invention.

The fact that the protection material is exclusively found in the protection edge technically allows it to be used in significant quantities, without compromising the efficiency of the photovoltaic cell. On the contrary, if the protection edge is made with the diffusion of the protection material also on the central surface of the perovskite layer, the amount of protection material itself cannot be too large so as not to compromise the passage of current and, therefore, the efficiency of the photovoltaic cell as a whole. In other words, if the protection material is also present on the central surface of the perovskite layer, its quantity is limited by the effects on the efficiency of the photovoltaic cell, consequently limiting the protection of the edges of the perovskite layer, which, instead, constitute the portion most exposed to humidity; on the other hand, if the protection material is exclusively present on the edge of the perovskite layer, its quantity can be chosen based only on its effectiveness as protection, therefore without considering its effects on the efficiency of the photovoltaic cell.

Said protection material preferably has a resistivity greater than or equal to 105 Ωcm at 25° C.

In this way, the use of an insulating protection material guarantees a high resistance to the passage of electric current through the protection edge to the advantage of the efficiency of the photovoltaic cell. Indeed, an insulating material maintains a high Shunt resistance, which forbids the passage of eddy current and, therefore, avoids the loss of efficiency of the photovoltaic cell.

Said protection material preferably is an inorganic material comprising lead; more preferably, said protection material is a lead salt, more preferably it is chosen in the group consisting of PbSO4, Pb3(PO4)2, PbCO3, PbS, PbO or PbO2.

Said protection material preferably consists of poorly soluble inorganic perovskites, in particular low-dimensional perovskites, such as CsPb2Br5 or Cs4PbBr6, or alternatively perovskites containing chloride.

Said protection material preferably consists of lattice structures other than perovskite and comprising lead halides and very bulky cations (phenylviologen).

Said protection edge is preferably obtained by means of a reaction of the lead halide perovskite or of a synthetic precursor thereof.

The photovoltaic cell preferably is a perovskite/silicon tandem solar cell.

BRIEF DESCRIPTION OF THE SEVERAL VIEWS OF THE DRAWING(S)

The invention will be best understood upon perusal of the following description of an embodiment thereof, provided by way of mere explanatory, non-limiting example, with reference to the accompanying figures, wherein.

DESCRIPTION OF SPECIFIC EMBODIMENTS OF THE INVENTION

Figure 1:
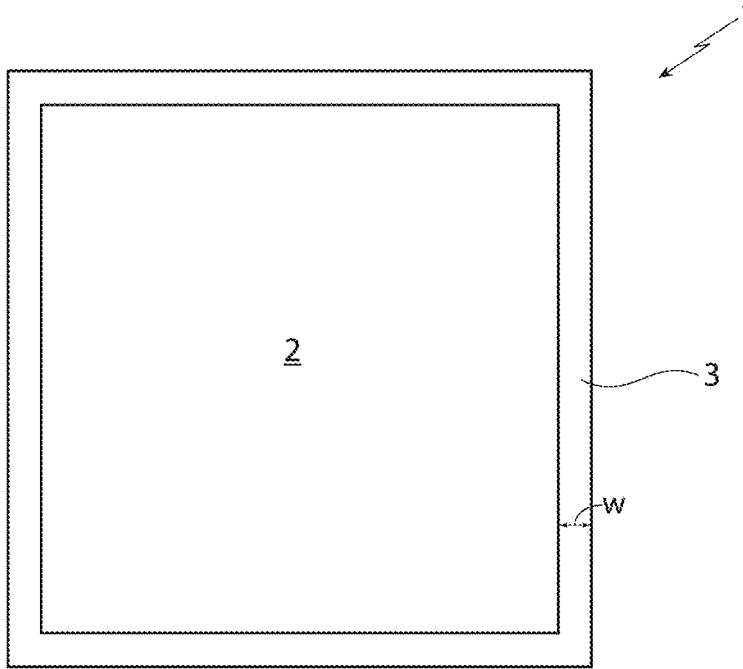
FIG. 1 is a plan view of photovoltaic absorber layer according to the invention.

In FIG. 1, number 1 indicates, as a whole, a photovoltaic absorber layer based on lead halide perovskite according to the invention. The photovoltaic absorber layer 1 comprises a lead halide perovskite layer 2 and a protection edge 3 consisting of a protection material such as to protect the lead halide perovskite layer from water.

According to the invention the protection edge 3 consists of a protection material having a solubility in water at 25° C. that is equal to or smaller than 5*10-4 mol/kgH2O.

This technical feature ensures that the protection edge creates a sort of humidity barrier.

Figure 2:
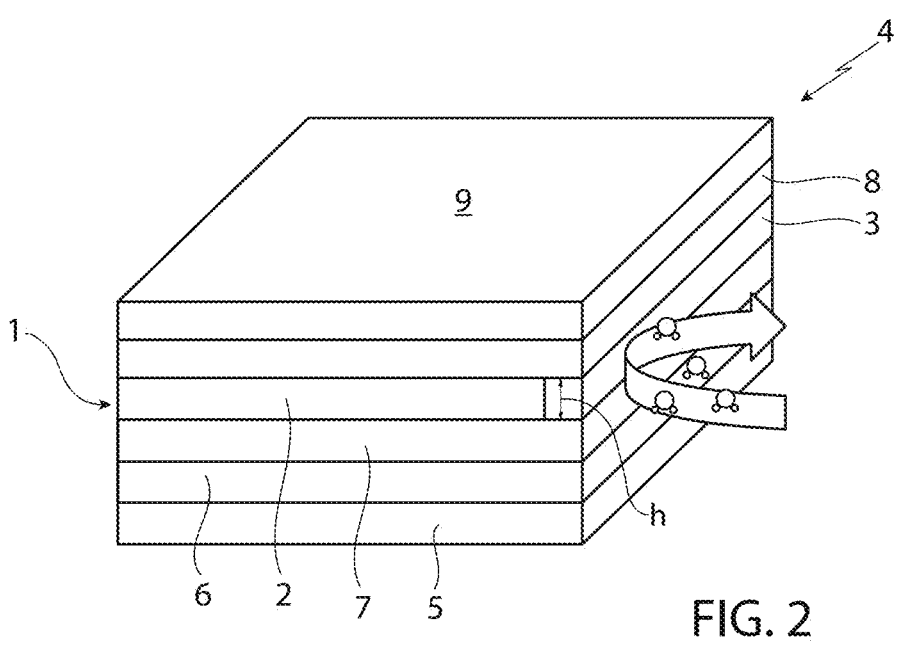
FIG. 2 shows, in an extremely schematic manner, a solar cell comprising the photovoltaic absorber layer according to the invention.

FIG. 2 shows, in an extremely schematic manner, an example of a tandem solar cell 4 including the photovoltaic absorber layer 1.

The tandem solar cell 4 comprises in sequence a silicon cell 5, a recombination layer 6, a hole contact layer (p) 7, the photovoltaic absorber layer 1, an electron contact layer (n) 8 and a transparent conductive oxide (TCO) layer 9.

In particular, the lead halide perovskite layer 2 is in direct contact both with the hole contact layer (p) 7 and with the electron contact layer (n) 8. Basically, the protection material exclusively constitutes the protection edge and is not present between the lead halide perovskite layer and the gap contact layer (p) 7 or the electron contact layer (n) 8.

The protection edge 3 has a height h equal to that of the lead halide perovskite layer and a width w ranging from 0.02 mm to 2 mm, preferably ranging from 0.05 mm to 1 mm.

As symbolically represented by the arrow in FIG. 2, the protection edge 3 has the function of preventing humidity from penetrating the lead halide perovskite layer 2, thus compromising its functionality.

Depending on the geometry of the photovoltaic cell and, therefore, on the exposure to the outside of the lead halide perovskite layer 2, it may be decided to place the protection edge 3 not along its entire perimeter, but only along its exposed sides.

Basically, the protection material making up the protection edge 3, for it has an extremely low solubility in water, creates a sort of barrier to water itself in order to protect, by so doing, the lead halide perovskite layer 2 from the effects of humidity.

The inventors have identified a non-exhaustive list of classes of materials that can constitute the protection edge 3 respecting the condition of having a solubility in water that is equal to or smaller than $5*10^{-4}$ mol/kg at a temperature of 25° C.

The first class concerns highly insoluble lead salts, such as, for example, PbSO4, PbS, Pb3(PO4)2 or PbCO3. These compounds cannot be defined as hydrophobic, but through them the diffusion of water is extremely slow due to their insolubility.

The second class concerns lead oxides (PbO, PbO2). Similarly to the first class of compounds, the diffusion of water through lead oxides is strongly slowed.

The third class concerns poorly soluble inorganic perovskites, in particular low-dimensional perovskites, such as CsPb2Br5 or Cs4PbBr6, or alternatively perovskites containing chloride.

The fourth class concerns lattice structures other than perovskite and comprising lead halides and very bulky cations (phenylviologen).

The classes of materials listed above can be directly created on an edge portion of the lead halide perovskite layer 2. The portion defining the protection edge 3 will be suitably delimited by means of masks or similar tools.

In particular, the first class of materials can be obtained by means of an exposure of the selected edge portion to solutions containing an anion such as for example $SO_4^{2-}$, whereas the second class of materials can be obtained by means of an exposure of the selected edge portion to oxidizing agents, such as $H_2O_2$ or $O_3$.

The edge portion can be created separately from the perovskite layer or it can be created by a reaction of the perovskite layer itself.

The reactions for the creation of the edge portion can be caused to take place on the lead halide perovskite already formed or on a precursor of the lead halide perovskite. This also depends on whether the formation of the lead halide perovskite is carried out in one or two steps.

The inventors have identified a non-exhaustive list of techniques for creating the protection edge 3.

The possible techniques involve "screen printing" already used for some time in the photovoltaic industry, "inkjet printing" where the reagent solution is deposited through very small nozzles, "spray coating" where the solution is conveyed on the substrate in the form of aerosols or small droplets and placed on the edges by means of special masks and "chemical vapour deposition" always through the use of masks.

With these techniques it is possible to convert the lead halide perovskite layer into a much more water-resistant material and, therefore, capable of creating a barrier to the penetration of water into the lead halide perovskite layer and of guaranteeing the effectiveness, in optoelectronic terms, of the lead halide perovskite layer even in the presence of humidity outside the photovoltaic cell.

As can be immediately seen, the information disclosed above with reference to a tandem photovoltaic cell, can apply to any photovoltaic cell comprising a lead halide perovskite layer whose optoelectronic characteristics must be preserved from humidity.

The invention claimed is:

1. A photovoltaic cell, comprising
at least one lead halide perovskite layer;
a protection edge arranged so as to peripherally surround said at least one lead halide perovskite layer;
wherein said protection edge has a height equal to that of the at least one lead halide perovskite layer and a width ranging from 0.02 mm to 2 mm, and consisting of a protection material having a solubility in water at 25° C. that is equal to or smaller than $5*10^{-4}$ mol/kgH2O;
wherein said protection material is exclusively present in said protection edge;
wherein said protection material is selected from a group consisting of: poorly soluble inorganic perovskites and a lattice structure other than perovskite and comprising lead halides and bulky cations.

2. The photovoltaic cell according to claim 1, wherein that said protection edge has a width ranging from 0.05 mm to 1 mm.

3. The photovoltaic cell according to claim 1, wherein said protection material has a resistivity greater than or equal to $10^{5}$ Ωcm at 25° C.

4. The photovoltaic cell according to claim 3, wherein said protection material is an inorganic material comprising lead.

5. The photovoltaic cell according to claim 4, wherein said protection material is chosen from a group consisting of: PbSO4, Pb3(PO4)2, PbCO3, PbS, PbO and PbO2.

6. The photovoltaic cell according to claim 1, wherein said photovoltaic cell is a perovskite/silicon tandem solar cell.

7. A method for manufacturing a protection edge of a photovoltaic cell according to claim 1,
wherein the method comprises exposing an edge portion of the lead halide perovskite layer or of a synthetic precursor thereof to a solution containing an anion or to an oxidizing agents.

8. The method according to claim 7, wherein that said exposing is carried out by a member of a group consisting of a screen printing process, an inkjet printing process and a spray coating process.

* * * * *